United States Patent
Mendel et al.

(10) Patent No.: US 12,191,893 B2
(45) Date of Patent: *Jan. 7, 2025

(54) SEEMINGLY MONOLITHIC INTERFACE BETWEEN SEPARATE INTEGRATED CIRCUIT DIE

(71) Applicant: Intel Corporation, Santa Clara, CA (US)

(72) Inventors: David W. Mendel, Sunnyvale, CA (US); Jeffrey Erik Schulz, Milpitas, CA (US); Keith Duwel, San Jose, CA (US); Huy Ngo, San Jose, CA (US); Jakob Raymond Jones, San Jose, CA (US)

(73) Assignee: ALTERA CORPORATION, San Jose, CA (US)

( * ) Notice: Subject to any disclaimer, the term of this patent is extended or adjusted under 35 U.S.C. 154(b) by 374 days.

This patent is subject to a terminal disclaimer.

(21) Appl. No.: 17/385,556

(22) Filed: Jul. 26, 2021

(65) Prior Publication Data

US 2022/0190843 A1 Jun. 16, 2022

Related U.S. Application Data

(63) Continuation of application No. 16/585,934, filed on Sep. 27, 2019, now Pat. No. 11,075,648, which is a (Continued)

(51) Int. Cl.
*H03M 9/00* (2006.01)
*G06F 1/12* (2006.01)
(Continued)

(52) U.S. Cl.
CPC ............... *H03M 9/00* (2013.01); *G06F 1/12* (2013.01); *G06F 13/4282* (2013.01); *H03K 19/17744* (2013.01)

(58) Field of Classification Search
CPC ........ H03M 9/00; G06F 1/12; G06F 13/4282; G06F 13/40; H03K 19/17744;
(Continued)

(56) References Cited

U.S. PATENT DOCUMENTS

| | | | |
|---|---|---|---|
| 4,107,651 A | 8/1978 | Martin | |
| 4,353,032 A | 10/1982 | Taylor | |

(Continued)

FOREIGN PATENT DOCUMENTS

EP 2330514 A1 6/2011

OTHER PUBLICATIONS

Bolsens, Ivo; "2.5D ICs: Just a Stepping Stone or a Long Term Alternative to 3D?;" Xilinx, 2011 (29 pages).
(Continued)

*Primary Examiner* — Farley Abad
(74) *Attorney, Agent, or Firm* — Fletcher Yoder, P.C.

(57) ABSTRACT

A seemingly monolithic interface between separate integrated circuit die may appear to be parallel or asynchronous from the perspective of the separate integrated circuit die. The signals of the seemingly monolithic interface, however, may actually be communicated between the separate die via serial and/or synchronous communication. In one method, a number of signals stored in a first parallel interface on a first integrated circuit die may be sampled. In some cases, at least one of the signals may be sampled more often than another one of the signals. A serial signal may be generated based on sampled signals. The serial signal may be transmitted to a corresponding second parallel interface on the second integrated circuit die.

20 Claims, 15 Drawing Sheets

Related U.S. Application Data continuation of application No. 15/392,209, filed on Dec. 28, 2016, now Pat. No. 10,439,639.

(51) Int. Cl.
*G06F 13/42* (2006.01)
*H03K 19/17736* (2020.01)

(58) Field of Classification Search
CPC . H01L 2224/16225; H01L 2224/48247; H01L 2924/15192; H01L 2924/15311; H01L 23/495
See application file for complete search history.

(56) References Cited

U.S. PATENT DOCUMENTS

| | | | |
|---|---|---|---|
| 4,760,378 A | 7/1988 | Iketani et al. | |
| 4,852,088 A | 7/1989 | Gulick et al. | |
| 5,222,105 A * | 6/1993 | Kinney | H03M 5/12 |
| | | | 375/333 |
| 5,251,319 A | 10/1993 | Wagai et al. | |
| 5,886,582 A | 3/1999 | Stansell | |
| 6,327,259 B1 | 12/2001 | Chiu et al. | |
| 6,378,109 B1 * | 4/2002 | Young | G06F 30/367 |
| | | | 716/115 |
| 6,460,105 B1 | 10/2002 | Jones et al. | |
| 6,501,766 B1 * | 12/2002 | Chaar | G06F 13/387 |
| | | | 370/257 |
| 6,859,466 B1 | 2/2005 | Chen et al. | |
| 7,266,128 B1 | 9/2007 | Goldhammer et al. | |
| 8,842,034 B1 | 9/2014 | Gong | |
| 9,595,495 B1 | 3/2017 | Patil | |
| 2004/0088460 A1 | 5/2004 | Poisner | |
| 2005/0007840 A1 * | 1/2005 | Watanabe | G11B 11/1053 |
| 2007/0156932 A1 | 7/2007 | Kasahara et al. | |
| 2009/0019235 A1 | 1/2009 | Harada et al. | |
| 2009/0077440 A1 * | 3/2009 | Inagawa | G06F 30/3312 |
| | | | 714/E11.155 |
| 2011/0261603 A1 * | 10/2011 | Jones | G06F 13/4265 |
| | | | 365/63 |
| 2012/0314738 A1 * | 12/2012 | Kashima | H04J 3/0697 |
| | | | 375/219 |
| 2013/0007570 A1 | 1/2013 | Seago et al. | |
| 2013/0022136 A1 | 1/2013 | Collins | |
| 2013/0278295 A1 | 10/2013 | Kim et al. | |
| 2014/0347088 A1 | 11/2014 | Huang et al. | |
| 2016/0301419 A1 | 10/2016 | Schram et al. | |
| 2017/0048358 A1 * | 2/2017 | Roberts | G06F 13/00 |
| 2018/0364299 A1 | 12/2018 | Whetsel | |

OTHER PUBLICATIONS

M.R. Stan et al., "Low-power encodings for global communication on CMOS VLSI", IEEE Transactions on Very Large Scale Integration (VLSI) Systems, vol. 5, No. 4, Dec. 1, 1997, XP055265054, ISSN: 1063-8210, DOI: 10,1109/92,645071.

Extended European Search Report for EP Application No. 17206410.7 mailed May 8, 2018.

* cited by examiner

SEEMINGLY MONOLITHIC INTERFACE BETWEEN SEPARATE INTEGRATED CIRCUIT DIE

CROSS-REFERENCE

This application is a continuation of U.S. patent application Ser. No. 16/585,934, filed Sep. 27, 2019, titled "Seemingly Monolithic Interface Between Separate Integrated Circuit Die," which is a continuation of U.S. patent application Ser. No. 15/392,209, filed Dec. 28, 2016, titled "Seemingly Monolithic Interface Between Separate Integrated Circuit Die," both of which are incorporated by reference in their entireties for all purposes. U.S. patent application Ser. No. 15/392,225, filed Dec. 28, 2016, titled "Interface Bridge Between Integrated Circuit Die," is also incorporated by reference in its entirety for all purposes.

BACKGROUND

This disclosure relates to an interface bridge between two separate integrated circuit die that may appear to operate as a monolithic interface by sending asynchronous signals synchronously based on latency specifications of the signals.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices are used in numerous electronic systems. Computers, handheld devices, portable phones, televisions, industrial control systems, robotics, and telecommunication networking—to name just a few—all use integrated circuit devices. Integrated circuit devices may be formed using lithography techniques that pattern circuitry onto a substrate wafer that is diced to form a number of (generally identical) individual integrated circuit die. Each integrated circuit die may include many different components, such as programmable logic fabric, digital or analog signal transmission circuitry, digital signal processing circuitry, application-specific data processing circuitry, memory, and so forth. In general, different components may be based on different underlying technologies. Thus, different components of an integrated circuit device may be better suited to different development cycles or fabrication techniques. For example, programmable logic fabric such as field programmable gate array (FPGA) fabric may scale well to smaller sizes and thus may benefit from greatly by newer lithography techniques. On the other hand, other technologies, such as certain analog signal transmission circuitry, may not scale as well and may be better suited for older fabrication techniques.

To enable different components of an integrated circuit device to be developed more independently, some of the components may be moved off-chip. Instead of a single monolithic design, a first integrated circuit die with some of the components may be fabricated separately from a second integrated circuit die with other components. As such, the various separate integrated circuit die may be fabricated using different lithography techniques or generations, and may be developed according to different schedules. Yet separating the components onto separate die may come at a cost. Namely, it may be difficult or impossible to use the same number of wires between the separate first integrated circuit die and the second integrated circuit die as may be found in a monolithic interface.

Many integrated circuit devices may communicate a large number of asynchronous signals over a monolithic interface with another internal component of the same integrated circuit. For example, a transceiver component that is connected to programmable logic device fabric may communicate a wide variety of asynchronous status or control signals through a monolithic parallel interface. Yet when a monolithic integrated circuit device is separated into different integrated circuit die, however, there may be fewer wires available to interconnect these components. Accordingly, it may be infeasible or impossible to connect each asynchronous signal across a unique interconnect wire as may be done using a monolithic interface.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

A seemingly monolithic interface may be provided between separate integrated circuit die. The seemingly monolithic interface may operate, from the perspective of the separate integrated circuit die, as if the interface were monolithic. In fact, however, the signals of the seemingly monolithic interface may be communicated between the separate die via serial and/or synchronous communication. By sampling different signals according to latency specifications of the signals, even signals that appear to be asynchronous or parallel may be communicated synchronously. In one example, signals may be stored in a first parallel interface on a first integrated circuit die. These signals may be sampled in a way that preserves the appearance of asynchronicity of the signals. In some cases, this may involve sampling at least one of the signals more often than another one of the signals. A serial signal may be generated based on the sampled signals. The serial signal may be transmitted synchronously and/or serially to a corresponding second parallel interface on the second integrated circuit die.

Various refinements of the features noted above may be made in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present disclosure alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
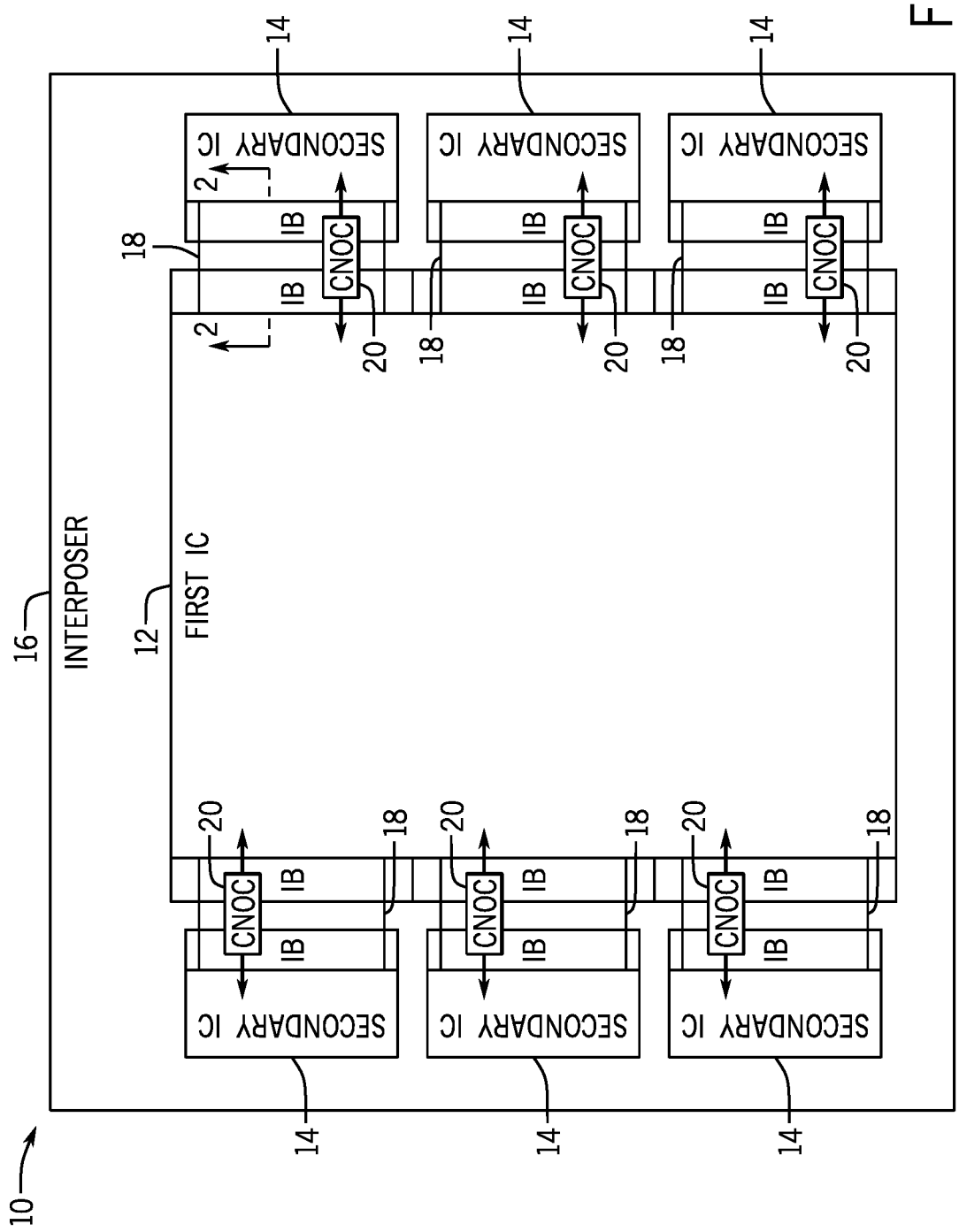
FIG. 1 is a schematic block diagram of a multi-die integrated circuit system that uses an interface bridge that appears monolithic from the perspective of the separate die, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

A multi-chip system may be represented as a 3D or 2.5D system of separate integrated circuit die that communicate signals between each other in an efficient matter. A 3D interconnection involves stacking integrated circuit die on top of each other, while a 2.5D interconnection involves connecting integrated circuit die through some form of bridge, such as a silicon interposer, a bridge structure disposed in a substrate (e.g., an Embedded Multi-die Interconnect Bridge (EMIB) by Intel Corporation), or a direct connection from one die to the other. In either a 3D or 2.5D arrangement, the number of connections available between the die may be fewer than would be available if the multiple die were instead part of a single monolithic integrated circuit die. Yet there are many reasons to separate the integrated circuit die. In particular, some technologies, such as analog technologies used in high-speed transceivers, may not scale as easily to newer lithography techniques as other circuitry, such as programmable fabric of a programmable logic device (PLD), such as field programmable gate array (FPGA) fabric. When different die are separated, however, the once-monolithic communication between them may be replaced with an efficient interface bridge communication system, such as the systems described in this disclosure.

Efficient communication between integrated circuit die may be obtained between different integrated circuit die that are separate, rather than part of a single, monolithic integrated circuit device. In some cases, it may be desirable to maintain communication between the integrated circuit die as if they were connected in a monolithic solution. That is, from the perspective of each separate integrated circuit die, it may be advantageous to appear to be monolithically connected in one larger integrated circuit die.

In a particular example involving programmable logic device (PLD) fabric, such as FPGA fabric, there may be a potentially wide variety of secondary integrated circuit die that may be connected to a first, main FPGA integrated circuit die. These secondary integrated circuit die may include a transceiver, digital processing circuitry, a central processing unit (CPU) subsystem, parallel input/output (I/O) off loading, digital signal processing (DSP) arrays, and the like. In addition, programmable logic fabric may be capable of being configured using a set of programming instructions (a configuration bitstream) received from an external source, such as a network or memory device. Thus, the interface bridge of this disclosure may appear to operate from the perspective of the user in the same way as previously available monolithic solutions.

With this in mind, systems and methods for providing an interface bridge between two integrated circuit die are provided. In particular, in at least some examples, one of the integrated circuit die may include programmable logic fabric, such as FPGA fabric. The interface bridge may provide efficient, compact interconnection between the different die. The interface bridge may use a source-synchronous connection to eliminate problems of synchronous crossing across the interface bridge, using adaptive logic in the base die to make return signals appear to be synchronous. Moreover, the interface bridge may operate as a layered protocol. That is, the interface bridge may use a hardened physical input/output (I/O) layer that operates under the control of a higher-level protocol layer that may be formed from hardened or soft logic. As mentioned above, the interface bridge may enable a variety of different integrated circuit die to be interconnected, such as a transceiver, a circuitry for digital protocol processing, a CPU subsystem, parallel I/O off loading, and other data processing offloading, such as DSP arrays or graphics processing unit (GPU) processors.

Monolithic circuit designs often include wide, parallel interfaces between circuit components that communication asynchronous signals between the components. For example, a monolithic programmable logic device may communicate with a transceiver component through a parallel status interface that may store hundreds of asynchronous status or operational control signals. These asynchronous status or control signals relate to the operation of the transceiver or the programmable logic fabric, or both. As mentioned above, however, it may desirable to separate certain components from the monolithic design into different integrated circuit die. When this is done, however, it may also be desirable to preserve the appearance from the perspective of each separate integrated circuit die of the same parallel status interface that communicates asynchronous signals between the components in the monolithic design.

As such, this disclosure teaches, among other things, an interface bridge between two separate integrated circuit die that preserves the appearance of asynchronicity for the asynchronous signals while communicating the signals synchronously and/or serially between the two integrated circuit die. In one example, asynchronous or seemingly asynchronous status or control signals may be provided to a parallel interface. The asynchronous status or control signals may be sampled at a variable frequency depending upon a latency sensitivity of each signal. Thus, for example, highly latency-sensitive signals from one integrated circuit die that are desired to be detected relatively more rapidly on the other integrated circuit die may be sampled and transmitted at a higher frequency by less latency-sensitive signals. By way of example, a more highly latency-sensitive status or control signal may be sampled and transmitted once every 20 time slots of a synchronous transmission, while a less latency-sensitive status or control signal may be sampled and transmitted once every 100 time slots. Additionally or alternatively, the asynchronous signals may be grouped by latency sensitivity and transmitted over separate communication wires between the integrated circuit die. By way of example, there may be 10 especially highly latency-sensitive signals and 90 less latency-sensitive signals. The 10 especially highly latency-sensitive signals may be sampled and transmitted serially over a first wire and the 90 less latency-sensitive signals may be sampled and transmitted serially over a second wire. Because the there are fewer signals transmitted over the second wire, the 10 especially highly latency-sensitive signals may be sampled and transmitted nine times more often than the 90 less latency-sensitive signal. It should be understood that these examples have been provided for guidance only, and that an actual implementation may involve any suitable number of signals.

With this in mind, an example integrated circuit (IC) system 10 includes a first integrated circuit (IC) die 12 connected to any suitable number of secondary integrated circuit (IC) die 14. The first IC die 12 and the secondary IC die 14 may be connected through any suitable conductive bridge, such as a silicon bridge 16 or a bridge structure disposed in a substrate (e.g., an Embedded Multi-die Interconnect Bridge (EMIB) by Intel Corporation) or a direct connection between the first IC die 12 and the secondary IC die 14. The first IC die 12 and the secondary IC die 14 may be any suitable integrated circuit devices. In one example, the first IC die 12 is an integrated circuit device that includes programmable logic fabric and the secondary IC die 14 are high-speed transceivers. The IC system 10 may benefit from the separateness of the first IC die 12 and secondary IC die 14 because the underlying technologies of these die may be different. As such, they may be developed in a more modularized way that is appropriate to the technology of each die.

While the examples provided below may refer to the first IC die 12 as a programmable logic device and refer to the secondary IC die 14 as high-speed transceivers, other types of integrated circuit devices may benefit from this disclosure. These may include digital processing circuitry, a central processing unit (CPU) subsystem, parallel input/output (I/O) off loading, digital signal processing (DSP) arrays, and the like.

The first IC die 12 may connect to the secondary IC die 14 through physical chip-to-chip interconnects of the silicon bridge 16 via a logical interface bridge (TB) 18 that controls the way signals are sent and received. That is, as used herein, the interface bridge (TB) 18 represents a logical connection between the first IC die 12 and the secondary IC die 14. The interface bridge (IB) 18 handles signal transfer between physical chip-to-chip interconnects of the silicon bridge 16.

The interface bridge (TB) 18 may allow a configuration network on chip (CNOC) 20 interface to extend between the first IC die 12 to the secondary IC die 14. The CNOC 20 allows configuration signals from the secondary IC die 14 to enter the first IC die 12 to be used to program programmable logic fabric of the first IC die 12. Even so, it should be understood that other types of integrated circuit die may be used that use other aspects of the interface bridge (IB) 18, but which do not provide the CNOC 20 because the first IC die 12 may not include the programmable logic fabric in all embodiments. Still, the interface bridge (IB) 18 may be particularly useful when the first IC die 12 contains programmable logic fabric, such as FPGA fabric.

Figure 2:
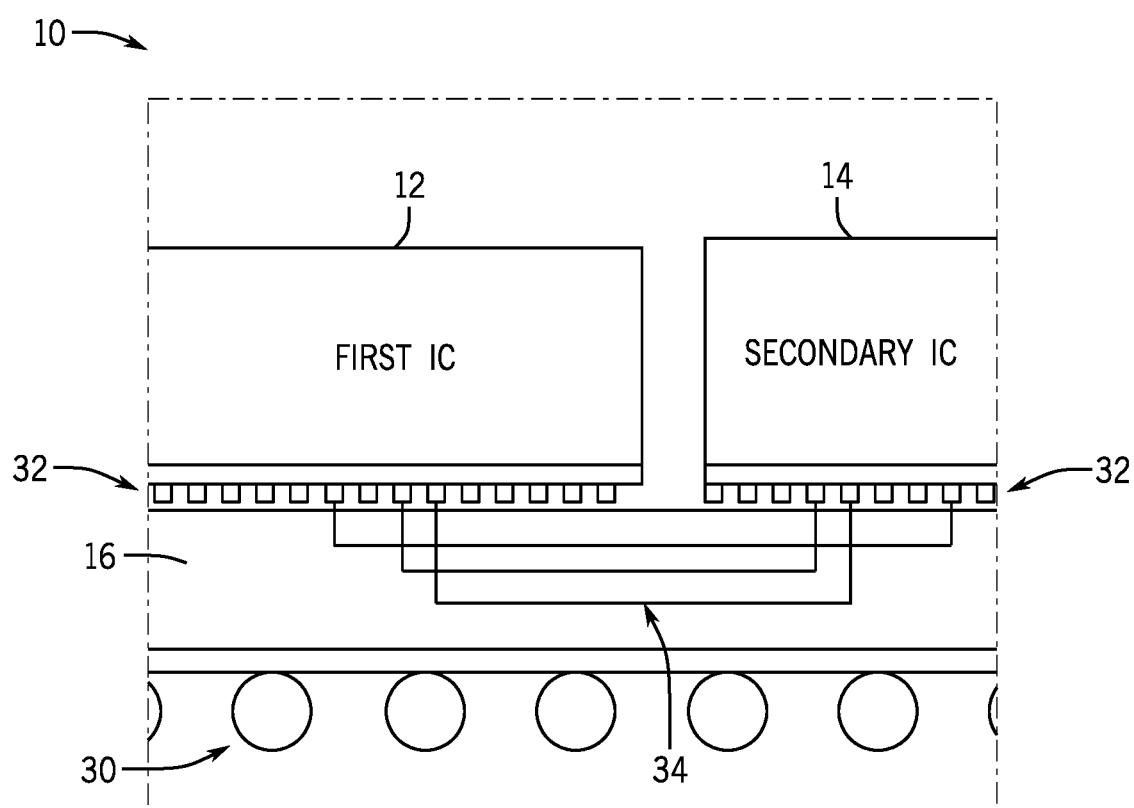
FIG. 2 is a schematic cross-sectional view of a portion of the integrated circuit device system of FIG. 1, in accordance with an embodiment.

FIG. 2 shows a schematic cross-sectional view of the IC system 10 along cut lines 2-2 of FIG. 1. As may be seen in FIG. 2, the silicon bridge 16 may be an interposer (as shown) or may be any other suitable silicon bridge (e.g., an interconnect bridge such as an Embedded Multi-die Interconnect Bridge (EMIB) by Intel Corporation) disposed on substrate. In other examples, the first IC die 12 and the secondary IC die 14 may be directly connected to one another through a form of stacking. In the example shown in FIG. 2, the silicon bridge 16 represents an interposer that uses a ball grid array (BGA) of solder balls 30, which may electrically connect to other circuitry, such as a printed circuit board (PCB) (not shown). The physical interconnection between the first IC die 12 and the secondary IC die 14 occurs through corresponding respective interconnect points 32 (here, taking the form of microbumps), which couple to each other through chip-to-chip interconnects 34 within the silicon bridge 16.

It should be understood that FIG. 2 represents a 2.5D arrangement that uses a silicon bridge 16 to connect the first IC die 12 and the secondary IC die 14. In other embodiments, the first IC die 12 and the secondary IC die 14 may be connected in a 3D arrangement, in which case the interconnect points 32 may directly connect to the other IC. For instance, the secondary IC die 14 may be stacked on top of the first IC die 12 and the interconnect points 32 may directly connect to corresponding interconnect structures on the first IC die 12.

In either a 2.5D or 3D arrangement, the first IC die 12 and the secondary IC die 14 may communicate through a relatively limited number of physical connections in relation to the number of connections that might be possible in a monolithic interface (i.e., if the first IC die 12 and the secondary IC die 14 were patterned onto a single monolithic integrated circuit die). To account for the limited number of physical connections between the first IC die 12 and the secondary IC die 14, the interface bridge (IB) 18 may efficiently communicate a variety of types of signals over the limited number of connections.

Figure 3:
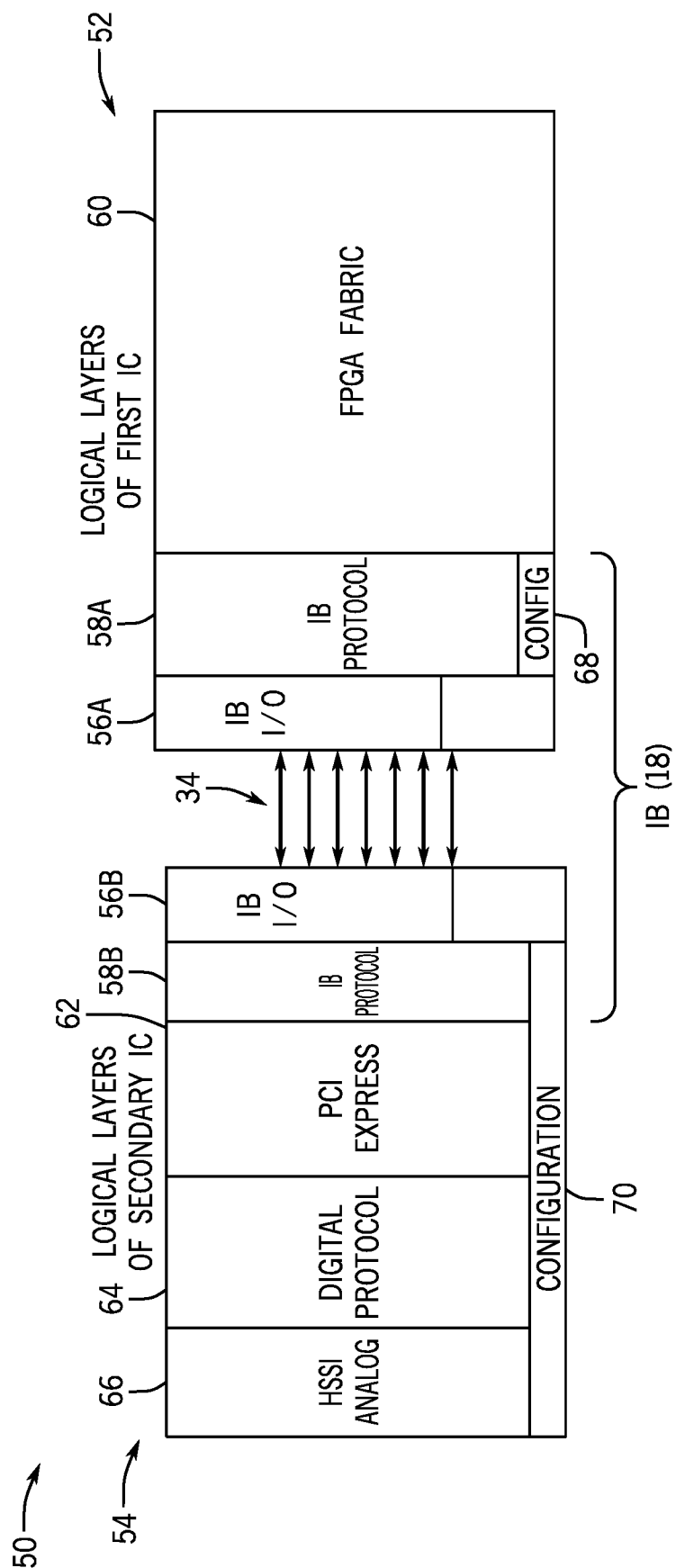
FIG. 3 is a block diagram illustrating logical layers of the circuitry of the integrated circuit device system of FIG. 1, in accordance with an embodiment.

In support of this, the interface bridge (IB) 18 may be logically divided into several logical layers, as shown by a layer diagram 50 of FIG. 3. In particular, the layer diagram 50 shows different logical layers 52 of the first IC die 12 and logical layers 54 of the secondary IC die 14 when the secondary IC die 14. The particular example of FIG. 3 illustrates logical layers that may be present when the secondary IC die 14 includes high speed serial interface (HSSI) transceiver circuitry and the first IC die 12 includes field programmable gate array (FPGA) fabric. The interface bridge (IB) 18 may be understood logically as formed by a physical input/output (I/O) layer 56A and a higher-level D3 protocol layer 58A on the first IC die 12, and a corresponding physical I/O layer 56B and higher-level IB protocol layer 58B on the side of the secondary IC die 14. The physical I/O layers 56A and 56B are physically connected to one another via the chip-to-chip interconnects 34.

The IB I/O layers 56A and 56B represent physical layers that transmit signals to, or receive signals from a corresponding interconnect point over the chip-to-chip interconnects 34. The physical IB I/O layers 56A thus may include circuitry to drive signals over the chip-to-chip interconnects 34 and/or receive signals from the chip-to-chip interconnects 34. Generally speaking, the physical IB/O layers 56A and 56B may be implemented through hardened logic circuitry. In some embodiments, however, the physical I/O layers 56A and/or 56B may be at least partially formed through programmable fabric that has been configured to operate as the physical D3 I/O layer.

The higher-level IB protocol layers 58A and 58B represent logical layers that operate on top of the physical operation of the physical D3 I/O layers 56A and 56B, respectively, to make the communication that takes place over the interface bridge (IB) 18 as seamless as possible. That is, when higher-level communication interacts with the interface bridge (IB) 18, the higher-level communication may not "see" the operation of the D3 protocol layers 58A and 58B or the physical signal transmissions that occur in the physical IB I/O layers 56A and 56B. The interface bridge (IB) 18 may appear to be invisible (e.g., a "black box") from the perspective of higher-level layers.

Some of the higher-level logical layers may include, on the first IC die 12, an FPGA fabric layer 60. The FPGA fabric layer 60 may communicate any suitable logical controls over the interface bridge (IB) 18 as if the FPGA fabric 60 were monolithically connected to the secondary IC die 14. For instance, the FPGA fabric 60 may operate using asynchronous status or control signals that may be received from the secondary IC die 14 via a source-synchronous connection over the interface bridge (IB) 18.

The secondary IC die 14 may also include higher-level logical layers such as a PCI express layer 62, a digital protocol layer 64, and/or an HSSI analog layer 66. These may be understood to represent various functions or operations that the secondary IC die 14 may be capable of performing. In the particular example of FIG. 3, these functions represent operational capabilities of an HSSI transceiver. However, other functions may take the place of these logical layers when the secondary IC die 14 includes other circuitry, such as memory circuitry. For example, when the secondary IC die 14 includes memory, the other logical layers beyond the interface bridge (TB) 18 layers 56B and 58B may include random access memory (RAM) functions. When the IC die 14 includes a central processing unit (CPU), the higher-level logical layers may include CPU data-processing functions.

Figure 14:
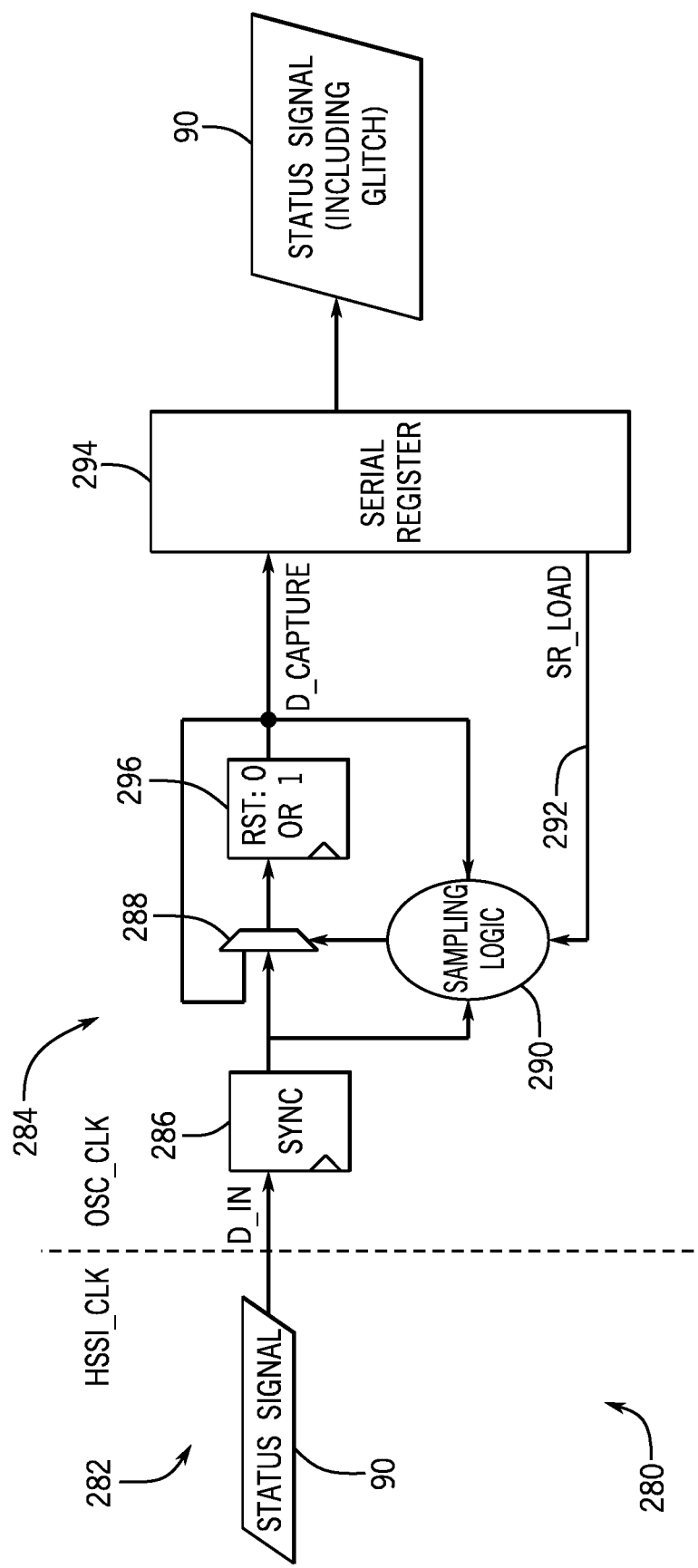
FIG. 14 is a policy-level block diagram of circuitry that can catch glitches in accordance with the flowchart of FIG. 13, in accordance with an embodiment.

When the first IC die 12 includes programmable logic fabric, as shown by the FPGA fabric layer 60, the IB protocol layer 58A may include configuration (CONFIG) logic 68. This may include, for example, a firewall or other configuration signal processing logic to ensure that configuration data received via the interface bridge (TB) 18 is only given access to secure portions of the FPGA fabric layer 60 when this is authorized. In one embodiment, the CONFIG logic 68 represents a dedicated path to a secure device manager (SDM) that firewalls access to secure areas of the FPGA fabric layer 60 (as shown in FIG. 14 and discussed further below). Because the secondary IC die 14 may allow configuration signals to be sent via the HSSI analog layer 66, the digital protocol layer 64, and/or the PCI express layer 62, these layers and the IB protocol layer 58B may include configuration logic 70. The configuration logic 70 may enable configuration signals to be received and sent to the FPGA fabric layer 60 to the IC die 12.

As noted above, two separate integrated circuit die may have separate circuit components. In prior monolithic designs where these separate components were combined in a single integrated circuit, these components would have communicated through internal monolithic interfaces between the components. In some cases, these monolithic interfaces may communicate asynchronous signals. When the separate components of the integrated circuit die are separated onto two different integrated circuit die, such as the first IC 12 and the secondary IC 14, it may be useful to maintain the same type of monolithic-style communication despite the separation of the first IC 12 and the secondary IC 14. This may provide a well-known and consistent look-and-feel of the communication between the circuitry of the integrated circuit of the first IC 12 and the secondary IC 14. That is, from the perspective of the first IC 12, the circuitry of the secondary IC 14 may appear to be accessible through an asynchronous monolithic interface, even though the actual communication between them may be synchronous and/or serial. Likewise, from the perspective of the secondary IC 14, the circuitry of the first IC 12 may appear to be accessible through the familiar asynchronous monolithic interface, even though the actual communication between them may be synchronous and/or serial.

Figure 4:
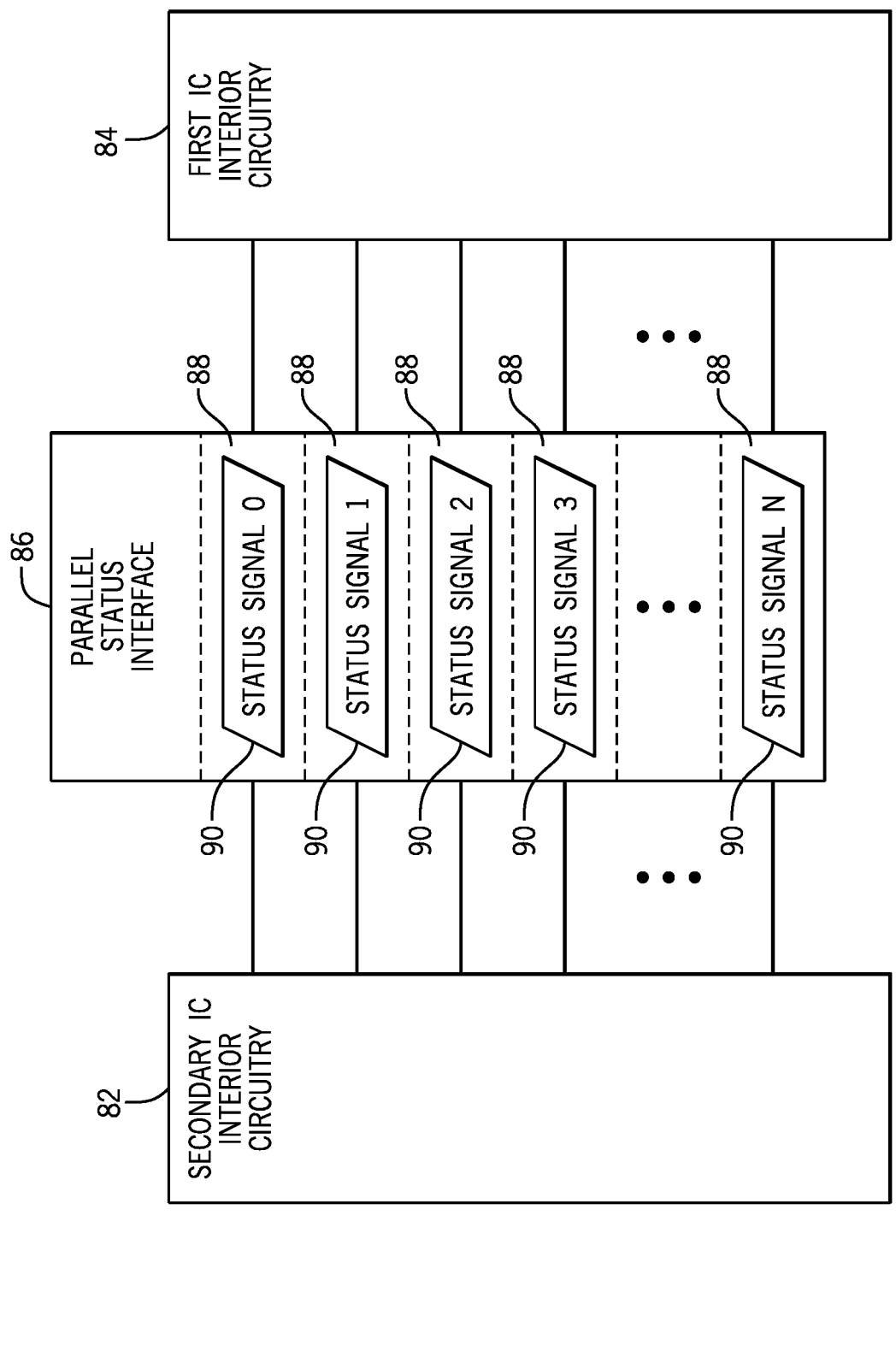
FIG. 4 is a block diagram representing how the interface bridge may appear to be monolithic from the perspective of the integrated circuit die, in accordance with an embodiment.

FIG. 4 is a block diagram of such a seemingly monolithic interface 80 as seen from the perspective of interior circuitry 82 (in the secondary IC 14) and from the perspective of interior circuitry 84 (in the first IC 12). As shown in FIG. 4, the seemingly monolithic interface 80 appears to allow the secondary IC circuitry 82 and the first IC circuitry 84 to communicate asynchronously with one another via a seemingly monolithic parallel status interface 86. The parallel status interface 86 includes a number of registers 88 that hold asynchronous status or control signals 90. Here, the parallel status interface 86 holds N+1 status or control signals 90, labeled 0, 1, 2, 3, . . . , N. The parallel status interface 86 may appear to hold any suitable number of status or control signals 90, or other types of asynchronous or parallel signals, as may be carried by an actual monolithic interface that would be found between two circuit components in a monolithic design. In actuality, as discussed further below, the seemingly monolithic parallel status interface 86 is carried out using synchronous and/or serial communication that samples and transmits the status or control signals 90 according to a latency specification of these signals. This thereby preserves an apparently asynchronous behavior of the status or control signals 90, despite transmitting the status or control signals 90 synchronously and/or serially.

Thus, it should be appreciated that the seemingly monolithic interface 80 shown in FIG. 4 is meant to be a schematic representation of the logical appearance of the communication interface between the second IC interior circuitry 82 and the first IC interior circuitry 84 from the perspective of these components. In one example, the first IC interior circuitry 84 may include programmable logic device fabric and supporting circuitry for the programmable logic device fabric (e.g., the first IC interior circuitry 84 may include field programmable gate array (FPGA) fabric and circuitry to support it). The secondary IC interior circuitry 82 may include a transceiver, such as a high speed serial interface (HSSI) transceiver. In such an example, the seemingly monolithic interface 80 may allow the secondary IC interior circuitry 82 to communicate status or control signals 90 such as power on reset (POR), phased locked loop (PLL) lock, first-in-first-out (FIFO) underflow, and so forth, in a way that is comparable to a monolithic interface in a monolithic design.

The total number of status or controls signals 90 that may be communicated using the seemingly monolithic interface 80 may be much greater than the available individual chip-to-chip interconnects 34. As a result, the interface bridge (IB) 18 of the integrated circuit 10 may preserve the logical appearance of the seemingly monolithic interface 80 shown in FIG. 4 by sampling the asynchronous signals according to particular priorities and transmitting the asynchronous data and control signals 90 on the bases of priority, thereby preserving the appearance of asynchronicity of the signals.

Figure 5:
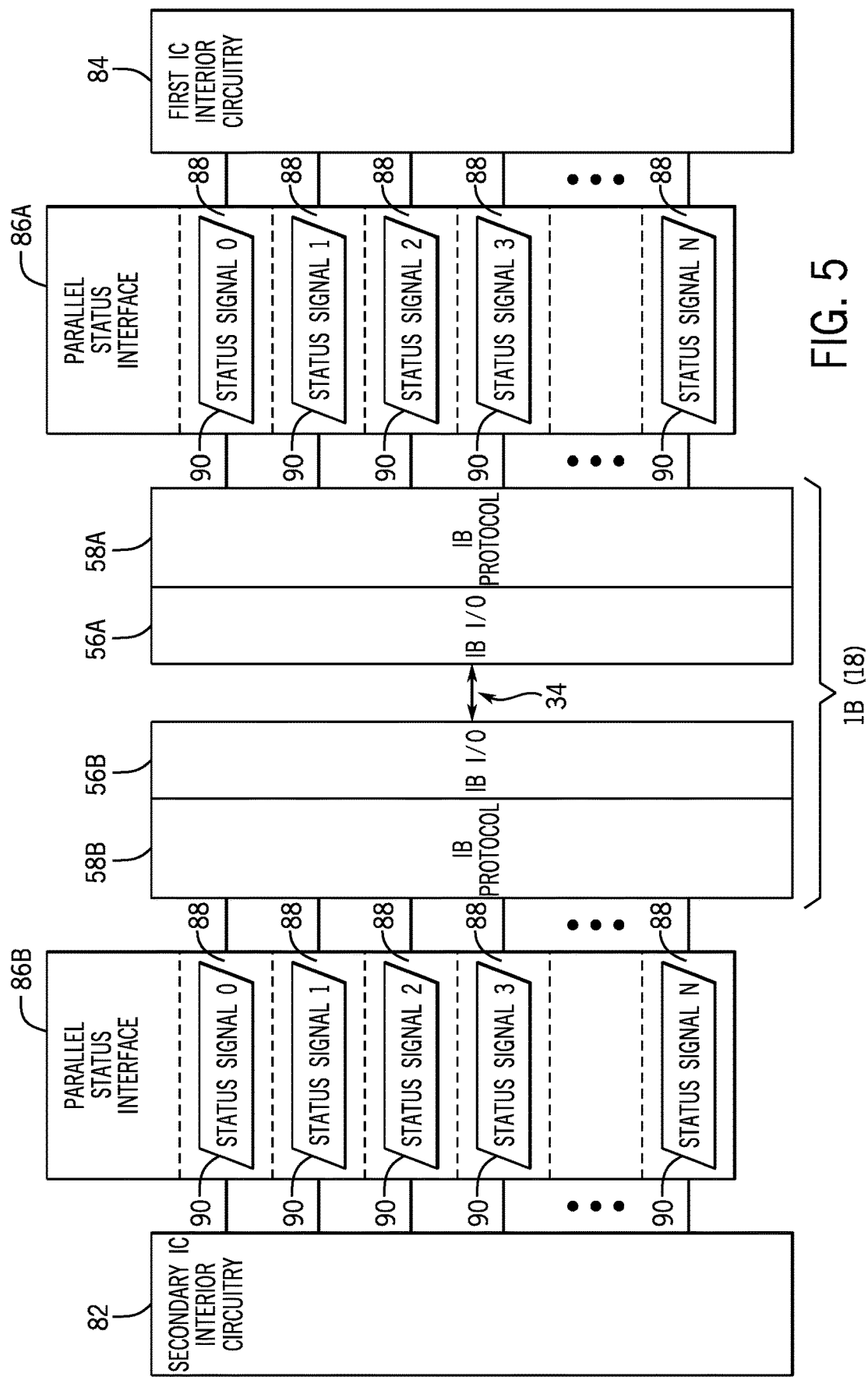
FIG. 5 is a block diagram of a serialized status interface of the interface bridge that may appear to be a monolithic parallel status interface from the perspective of the integrated circuit die, in accordance with an embodiment.

An example of circuitry that may implement the seemingly monolithic interface 80 is shown in FIG. 5. In this example, the first IC interior circuitry 84 may interface with a first parallel status interface 86A on the side of the first IC 12. For example, the first IC interior circuitry 84 may read or write the status or control signals 90 into respective registers 88 of a local parallel status interface 86A that is disposed on the first IC 12. There may be a corresponding local second parallel status 86B disposed on the secondary IC 14, from which the second IC interior circuitry 82 may read or write the status or control signals 90 into respective registers 88. The D3 I/O layers 56A and 56B and/or the D3 protocol layers 58A or 58B may sample the asynchronous status or control signals 90 from the first parallel status interface 86A or second parallel status interface 86B according to the priority of the status or control signals 90—such as the sensitivity of each status or control signal 90 to latency—and send the status or control signals 90 through a fewer number of channels of the chip-to-chip interconnects 34 than would be used by a monolithic interface. For instance, there may be one hundred or more status or control signals 90 that are updated to or from one parallel status interface 86A or 86B to the other parallel status interface 86B or 86A through only one or a few channels of the chip-to-chip interconnects 34.

Figure 6:
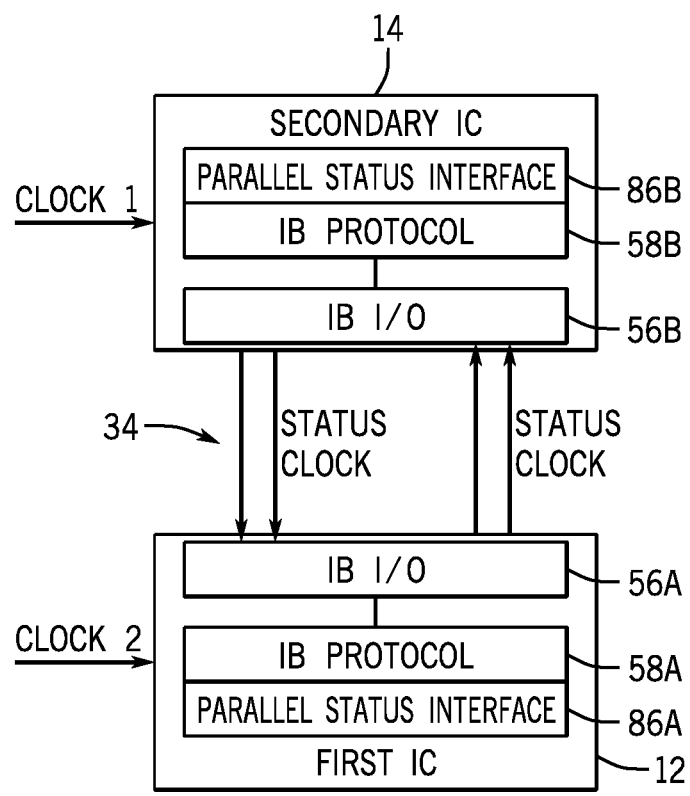
FIG. 6 is a block diagram illustrating a source-synchronous data transfer mode of operating the serialized status interface of FIG. 5, in accordance with an embodiment.

As shown in FIG. 6, in one example, the communication channels between the first IC 12 and the secondary IC 14 may operate using source-synchronous communication. That is, the secondary IC 14 may use a different clock (e.g., CLOCK 1) than a clock used by the first IC 12 (e.g., CLOCK 2). From the perspective of the secondary IC 14, however, the source synchronicity of the communication between the first IC 12 and the secondary IC 14 involves basing the receive data clock used by the interface bridge (IB) 18 on the clock from the secondary IC 14 (e.g., CLOCK signal from the secondary IC 14). In other examples, the receive data clock used by the interface bridge (IB) 18 may be based on the clock (e.g., CLOCK 2) of the first IC 12 instead. When the secondary IC 14 provides the receive data clock (e.g., CLOCK signal from the secondary IC 14), the IB I/O layer 56A or the IB protocol layer 58A on the first IC 12 will use the receive data clock to receive and transmit the status or control signals along with the receive data clock. That is, the IB I/O layer 56A or the IB protocol layer 58A may receive the receive data clock from the D3 I/O layer 56B or the IB protocol layer 58B of the secondary IC 14 and use that clock to both recover the status signals sent by the secondary IC, as well as to send status signals to the secondary IC 14. From the perspective of the secondary IC 14, the data receive clock used in communication with the first IC 12 is based on its own clock.

Using this source-synchronous serial communication, the interface bridge (IB) 18 may communicate the status or control signals 90 of the parallel status interfaces 86A or 86B to and from one another using serial communication, while preserving the appearance of asynchronicity of the status or control signals 90. An example by which the circuitry of the secondary IC 14 may transmit the status or control signals 90 to the circuitry of the first IC 12 is described in FIGS. 7-10, but it should be understood that similar circuitry may be employed to send the status or control signals 90 from the first IC 12 to the secondary IC 14.

Figure 7:
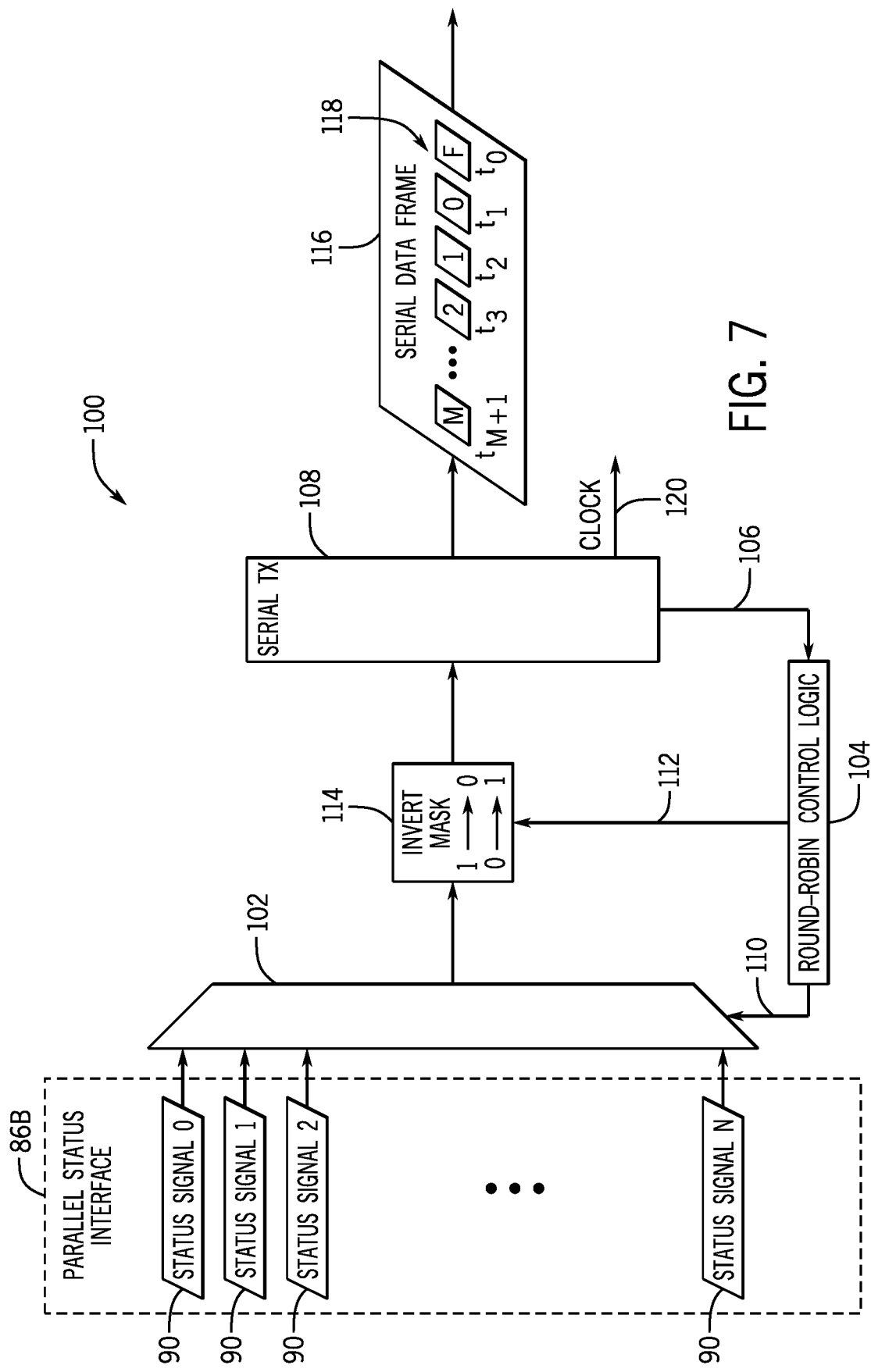
FIG. 7 is a block diagram of circuitry that uses time division multiplexing (TDM) to transmit latency-sensitive asynchronous status or control signals, in accordance with an embodiment.

FIG. 7 illustrates a transmission side 100 of a serialized status interface that may be used to carry out the seemingly monolithic interface 80 of FIG. 4. It should be appreciated that the circuitry of FIG. 7 is intended to be a schematic representation of the type of circuitry that may be employed to perform the methods of this disclosure, and that there may be more or fewer components, as desired, than shown in FIG. 7. In the example of FIG. 7, a time division multiplexer 102 is controlled to select certain of the status or control signals 90, one at a time, by round-robin control logic 104, which receives a serial load signal 106 from a serial transmitter 108, thereby generating a selection signal 110. The round-robin control logic 104 may be implemented as hard or soft logic that carries out a selection order of the status or control signals 90. The selection order may be agreed upon with similar receiving circuitry located on the other integrated circuit die. The agreed-upon selection order may be fixed or may be dynamic depending on an operation of the first IC die 12 or secondary IC die 14.

The round-robin control logic 104 may also generate a control signal 112 to cause an invert mask 114 to selectively invert the status or control signal 90 that has been selected by the round-robin control logic 104. In general, the round-robin control logic 104 may use the control signal 112 to cause the invert mask 114 to invert certain status or control signals 90 that are normally expected to be at a logically high ("1") state. Thus, when all of the status or control signals 90 are in an expected or most likely state, the resulting output of the invert mask 114 will be only logically low ("0") signals that may consume less power to transmit. This may allow the serial transmitter 108 to send a set of low signals in a serial data frame 116.

The serial data frame 116 may include some number of individual time slots 118 representing the individual status or control signals 90. In the example of FIG. 7, the serial data frame 116 carries a total number M of the status or control signals 90. A first time slot 118 of the serial data frame 116 may be a flag bit or bits ("F"). The serial transmitter 108 may generate the flag bit or bits "F" as one bit or as multiple bits, which may be the first bit or the first several bits of the serial data frame 116, and which may indicate whether all or a subset of the remaining M time slots 118 from 1 to M+1 contain logical zeros. As will be discussed below, this may allow the receiving circuitry to read the flag bit or bits "F" and determine whether to read any other time slots 118 of the serial data frame 116 that follow, further saving power when the status or control signals 90 are all logically low. This may save a substantial amount of power on both the transmitting and receiving side of the interface bridge (IB) 18. The serial transmitter 108 may also send a receive data clock (CLOCK) 120 with the serial data frame 116.

Figure 8:
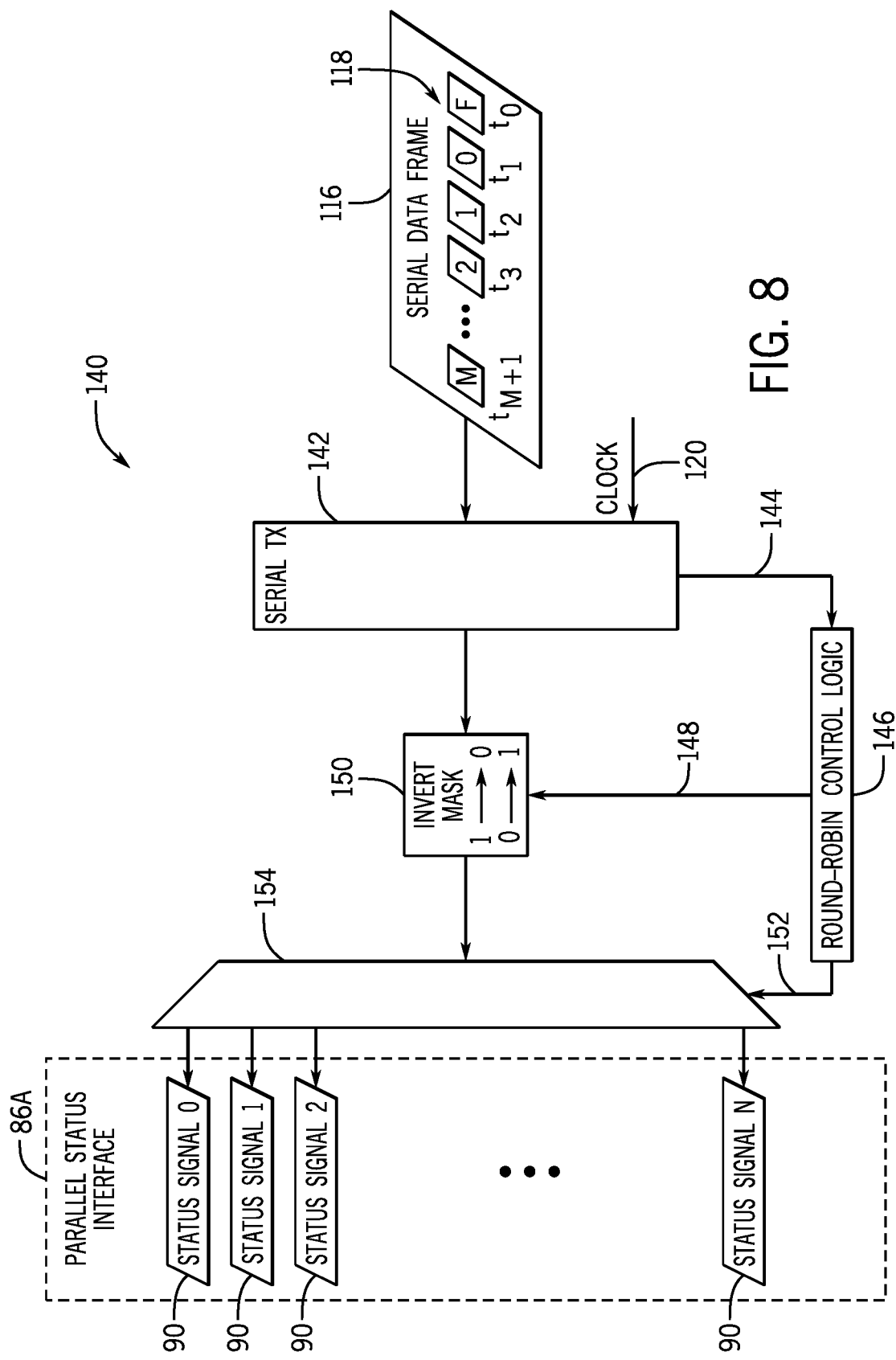
FIG. 8 is a block diagram of circuitry that uses time division multiplexing (TDM) to receive latency-sensitive asynchronous status or control signals, in accordance with an embodiment.

The serial data frame 116 and the clock signal 120 are transmitted over the chip-to-chip interconnects 34 to a receiving side 140 of the serialized status interface, as shown in FIG. 8. The receiving side 140 may receive, demultiplex, and store the status or control signals 90 into the parallel status interface 86A of the receiving integrated circuit die (e.g., the first IC 12). As mentioned above with reference to transmission side 100 shown in FIG. 7, the circuitry of FIG. 8 is intended to be a schematic representation of the type of circuitry that may be employed to perform the methods of this disclosure, and that there may be more or fewer components, as desired, than shown in FIG. 8.

In FIG. 8, the serial data frame 116 with the individual time slots 118 of the status or control signals 90 that have been serialized by the serialized status interface transmission circuitry 100 may be received by a serial receiver 142. The serial receiver 142 also receives the data receive clock 120. The serial receiver 142 may read the flag bit "F" and determine whether to continue reading the remainder of the serial data frame 116. The serial receiver 142 generates a register read signal 144 to the round-robin control logic 146 that is used to demultiplex serial data from the serial data frame 116. The round-robin control logic 146 thus generates a control signal to an invert mask 150 that reverses the inversion of the invert mask 114 based on the agreed-upon selection order of the status or control signals 90. The round-robin control logic 146 also generates a selection signal 152 for one or more demultiplexers 154 to demultiplex the received serialized status or control signals 90 for storage in the parallel status interface 86A.

Figure 9:
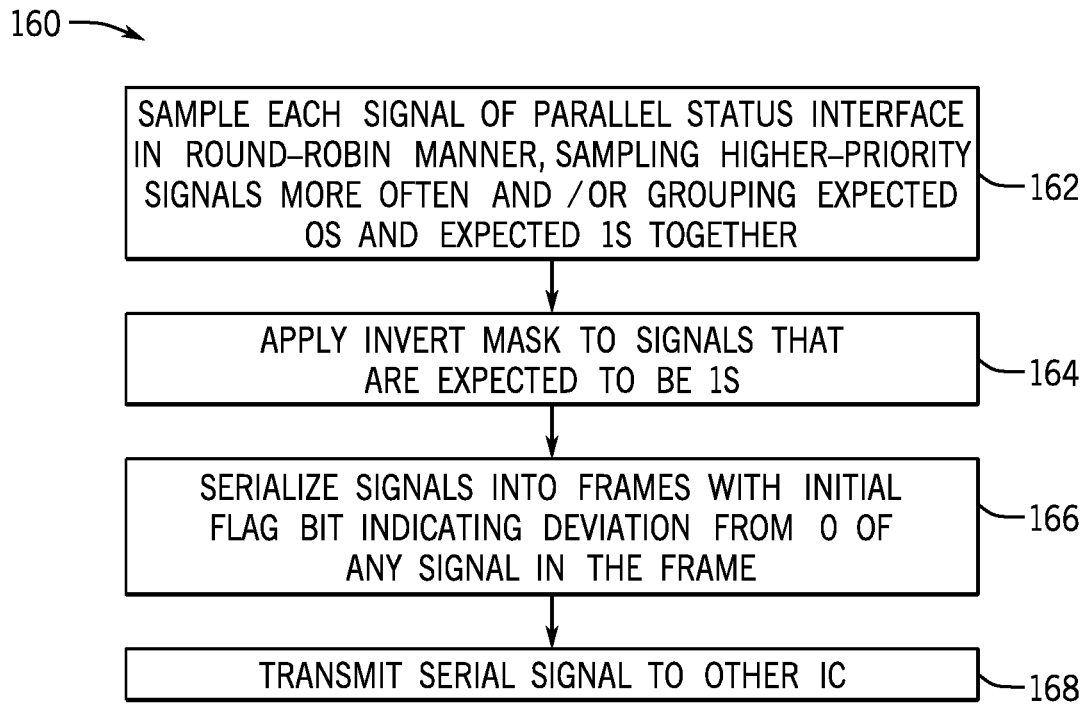
FIG. 9 is a flowchart of a method for sending asynchronous signals via the serialized status interface, in accordance with an embodiment.
Figure 10:
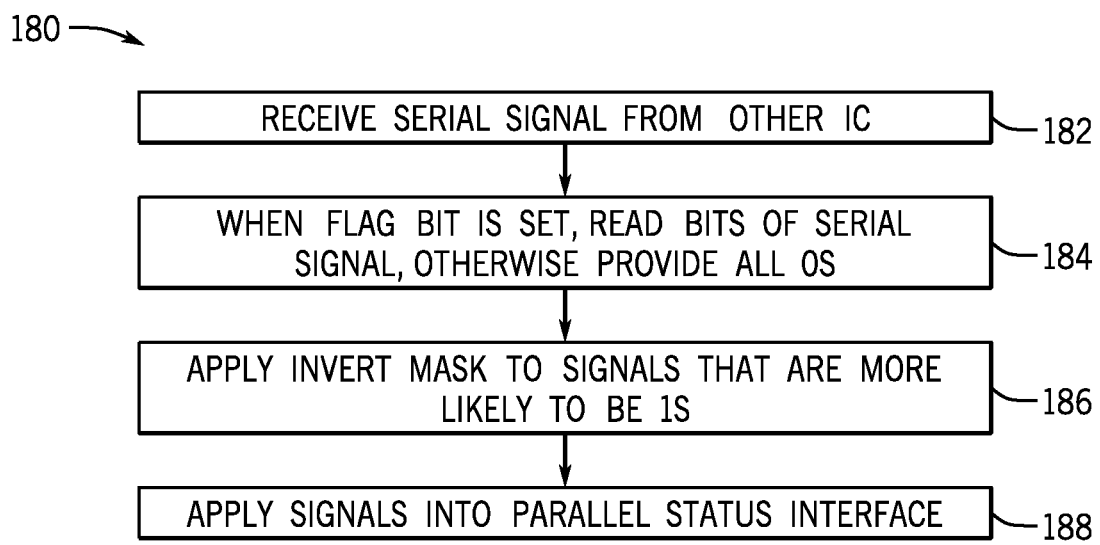
FIG. 10 is a flowchart of a method for receiving asynchronous status signals via the serialized status interface, in accordance with an embodiment.

FIGS. 9 and 10 are flowcharts of methods for carrying out the time division multiplexing of the asynchronous signals from the parallel status interface 86B to 86A. In particular, FIG. 9 describes the transmission of the asynchronous status or control signals 90 over a serial connection, and FIG. 10 describes the reception of the serialized status or control signals 90. In particular, a flowchart 160 of FIG. 9 begins when asynchronous signals, such as the status or control signals 90 of the parallel status interface 86B, are sampled in a round-robin manner (block 162). Any suitable circuitry may be used to do this, including the circuitry described above with reference to FIG. 7. Certain of the status or control signals 90 may change more often or may have a greater impact on the operation of the first IC 12. As such, these higher-priority status or control signals 90 may be sampled at a higher frequency. For example, a higher-priority status or control signal 90 may be sampled once every 20 time slots 118 of the serial data frames 116, while lower-priority signals may be sampled once every 100 time slots 118. The order in which the status of control signals 90 are sampled in may also vary depending on whether these signals are expected to be normally a logical low ("0") or a logical high ("1"). These may be grouped together for efficiency. Indeed, status or control signals 90 that have been sampled and that are expected to be logical high ("1") may be inverted using an invert mask (block 164). This may reduce the power consumption of the serial communication because the serial transmitter may send more logical lows and fewer logical highs.

In addition, the status or control signals may be serialized into serial data frames 116 that have an initial flag bit or bits "F" indicating whether any of the signals of subsequent time slots 118 of the serial data frame 116 deviate from zero (block 166). The serial data frame(s) 116 may be serially transmitted to the receiving integrated circuit die (block 168).

A flowchart 180 of FIG. 10 represents a method for receiving a serial signal containing status or control signals 90. Namely, the receiving integrated circuit die (e.g., the first IC 12) may receive the serial data frame 116 from the other IC (e.g., the secondary IC 14) (block 182). When the flag bit or bits "F" is set, the serial frame 116 may be read; otherwise, the remaining time slots 118 of the serial data frame 116 may not be read and a signal of all zeros may be inferred. The serial receiver 142 thus may receive the status or control signals 90 that were transmitted in the serial data frame (block 184). An invert mask (e.g., the invert mask 150) may be applied to the received data signals that are expected normally to be one (block 186). It should be appreciated that the invert mask may be applied according to a previously agreed upon selection order. The now-reconstituted status or control signals 90 may be stored into the local parallel status interface (e.g., the parallel status interface 86A) of the receiving integrated circuit die (e.g., the IC 12) (block 188). This may preserve the appearance of asynchronicity of the asynchronous status or control signals 90 while communicating them through serialized communication between the two separate IC dies (e.g., between the first IC 12 and the secondary IC 14).

Figure 11:
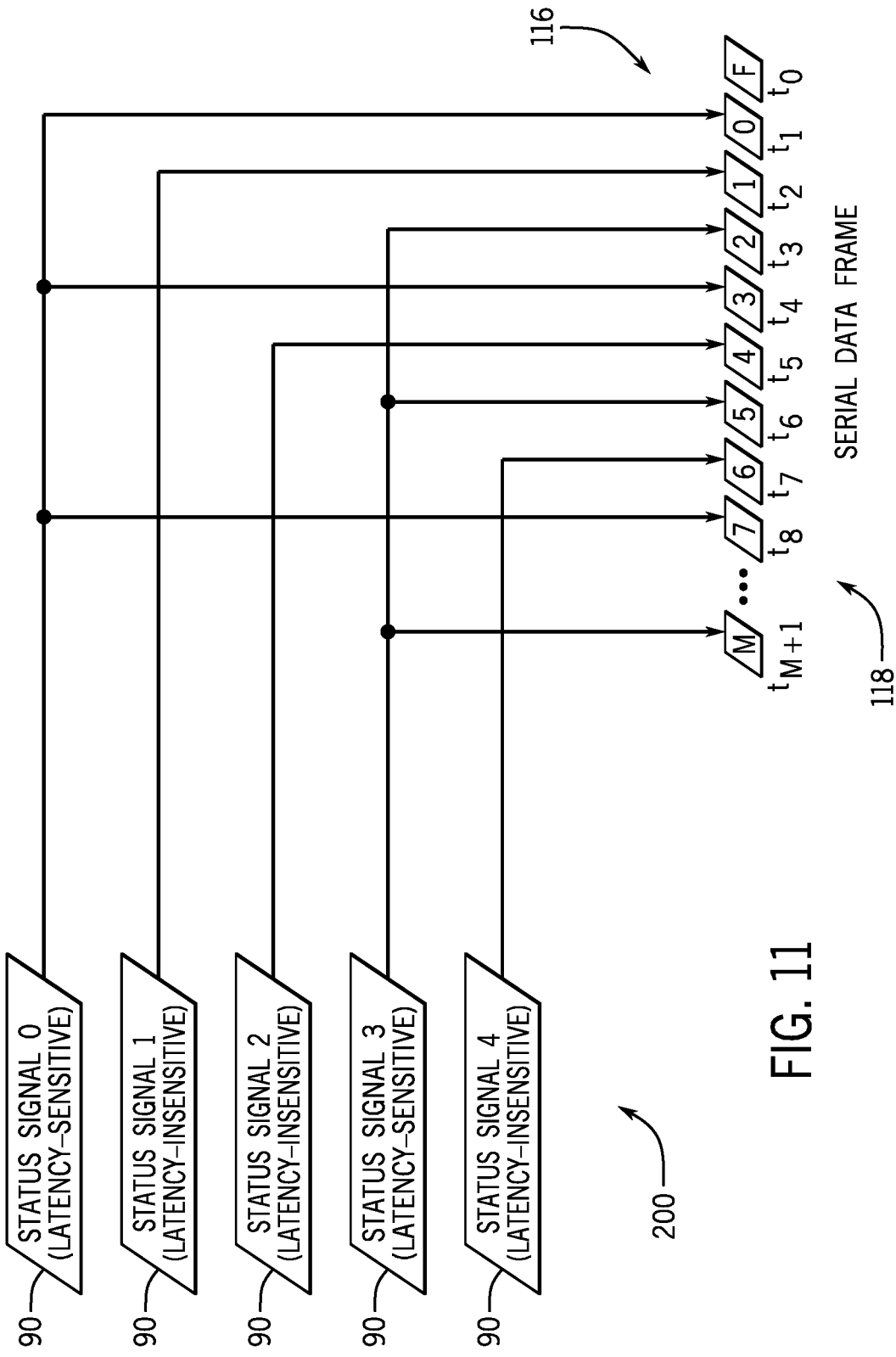
FIG. 11 is a block diagram of an example of transmitting an asynchronous status signals, in which latency-sensitive status signals are sampled more often than latency-insensitive status signals, in accordance with an embodiment.

A schematic example of sampling order for the serialized status interface transmission appears as a block diagram 200 of FIG. 11. The example of FIG. 11 includes only five status or control signals 90. In practice, however, it should be understood that any suitable number of status or control signals, or any other form of asynchronous signal that be desired to be communicated, may be used in an actual implementation. As shown in FIG. 11, a serial data frame 116 may include some number of separate time slots $t_0$, $t_1$, $t_2$, . . . , $t_{M+1}$. In FIG. 11, the status or control signals 90 that are labeled "STATUS SIGNAL 0" and "STATUS SIGNAL 1" are more latency-sensitive than the remaining status or control signals 90. This may be the case, for example, for signals such as a reset signal or FIFO underflow signal. Indeed, some latency-sensitive signals may have a latency sensitivity on the order of a few nanoseconds to 500 ms. Thus, the status or control signals 90 that are labeled "STATUS SIGNAL 0" and "STATUS SIGNAL 1" may be sampled at a higher frequency to ensure that they are updated more quickly. The remaining signals may be sampled less frequently.

Moreover, while FIG. 11 shows the status or control signals 90 labeled "STATUS SIGNAL 0" and "STATUS SIGNAL 1" as being sampled more quickly within the same serial data frame 116, it should be appreciated that this may be done across multiple serial data frames 116. For example, the more latency-sensitive status or control signals 90 labeled "STATUS SIGNAL 0" and "STATUS SIGNAL 1" may be sampled for every serial data frame 116 or every other serial data frame 116 that is transmitted, while the remaining status or control signals 90 may be sampled only every other or only at some multiple of the serial data frames 116.

Figure 12:
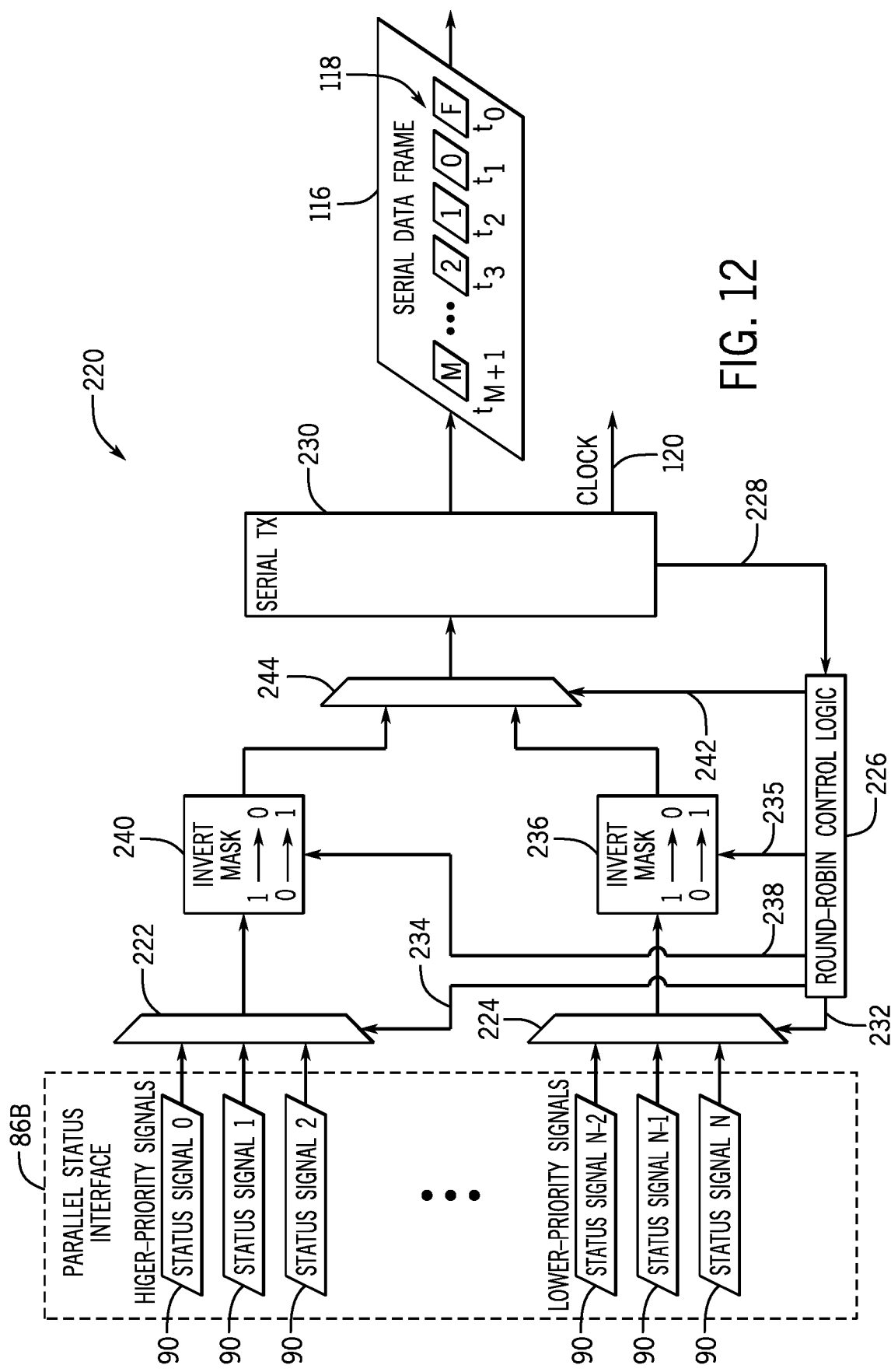
FIG. 12 is a block diagram of another example of a serialized status interface, in accordance with an embodiment.

FIG. 12 is another example of circuitry that may be used for the serialized status interface. In the example of FIG. 12, serialized status interface transmission circuitry 220 includes separate multiplexers 222 and 224 for higher-priority status or control signals 90 and lower-priority status or control signals 90, respectively. Round-robin control logic 226, based on a serial load signal 228 from a serial transmitter 230, may cause the higher-priority signals 90 to be selected and sampled at a higher frequency than the lower-priority status or control signals 90 using selection signals 232 and 234. The round-robin control logic 226 may also generate an inversion control signal 235 to control an invert mask 236 and send the selection signal 238 to control an invert mask 240, which may operate in the same manner as discussed above with reference to FIG. 7. A control signal 242 may select in a multiplexer 244 whether to provide a higher-priority status or control signal 90 or a lower-priority status or control signal 90 into the serial transmitter 230 using a selection signal 242. It may be appreciated that a single invert mask may be used instead of the invert masks 236 and 240 shown by being placed between the multiplexer 244 and the serial transmitter 230. The serial transmitter 230 may collect and transmit the signals obtained from the multiplexer 244 into time slots 118 of serial data frames 116, in a manner similar to that of the serial transmitter 108 discussed above with reference to FIG. 7.

Figure 13:
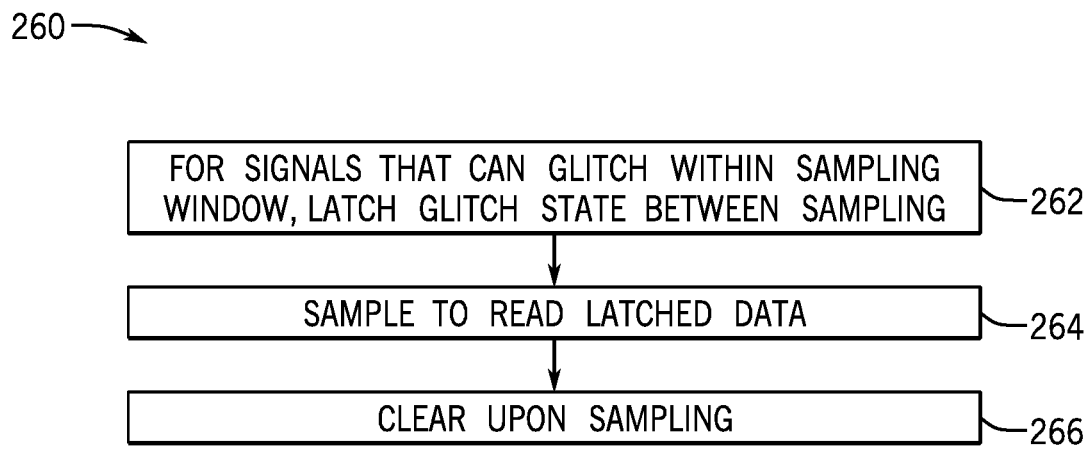
FIG. 13 is a flowchart of a method for capturing status signal glitches, in accordance with an embodiment.

It may be valuable to identify when the asynchronous status or control signals 90 glitch—that is, switch from an expected value to a different value faster than a sampling window. As such, the status or control signals 90 may be sampled in a way that catches such glitches. For example, as shown by a flowchart 260 of FIG. 13, for signals that are known to glitch within the sampling window, the glitch state, when it occurs, may be latched between sampling (block 262). If the glitch did not occur, then the glitch is not latched. Instead, the data signal is latched. In either case, the latched signal may be sampled (block 264) and it is this latched data signal that is read that may be transmitted across the serialized status interface. After reading the signal, glitch detection logic may be reset (block 266) to await a possible future glitch that could occur within the next sampling window.

FIG. 14 provides an example of such glitch detection circuitry 280 on a policy level, representing the type of circuitry that may be used to sample status or control signals 90 that are believed to potentially glitch. As shown in FIG. 14, the status or control signal 90 may be operating according to a local clock signal of one of the IC integrated circuit die, such as the secondary IC 14. In one example, the secondary IC 14 may be an HSSI transceiver. Thus, the status signal 90 may be clocked according to the HSSI clock, or may be an unclocked signal. A separate clock 284 may read the status or control signal 90 (e.g., a serial transmission clock "OSC_CLK"). When the status signal 90 is a clocked signal, rather than unclocked signal, the OSC_CLK may be faster than the HSSI_CLK by some multiple. A synchronization register 286 may read the status or control signal 90 and provide the signal to a multiplexer 288.

The multiplexer 288 may be controlled by sampling logic 290 that receives a register load ("SR_LOAD") signal 292 from a serial register 294 and determines whether to provide the current data signal from the register 286 or a data capture signal ("D_CAPTURE") from a glitch detection register 296. The glitch detection register 296 may initially reset to a normal, non-glitch state of the status or control signal 90, which may be a logical high or a logical low depending on the type of status or control signal 90 that is being sampled, at the start of a sample window that includes several edges of the OSC_CLK. The sampling logic 290 may compare the D_CAPTURE signal to the output from the register 286. When these are values different, the sampling logic 290 may provide the output from the register 286 to the glitch detection register 296, causing the glitch detection register 296 to be set with the glitch state for the remaining duration of the sample window. The value of D_CAPTURE may be stored in the serial register. Thus, if there is no glitch in the current status or control signal 90 that is being sampled during the sample window, the serial register 294 receives the normal state of the current status or control signal 90. However, if any glitch is detected at any point in the sampling window, the serial register 294 receives the glitch state of the current status or control signal 90. The serial register 294 may provide this signal for transmission.

Figure 15:
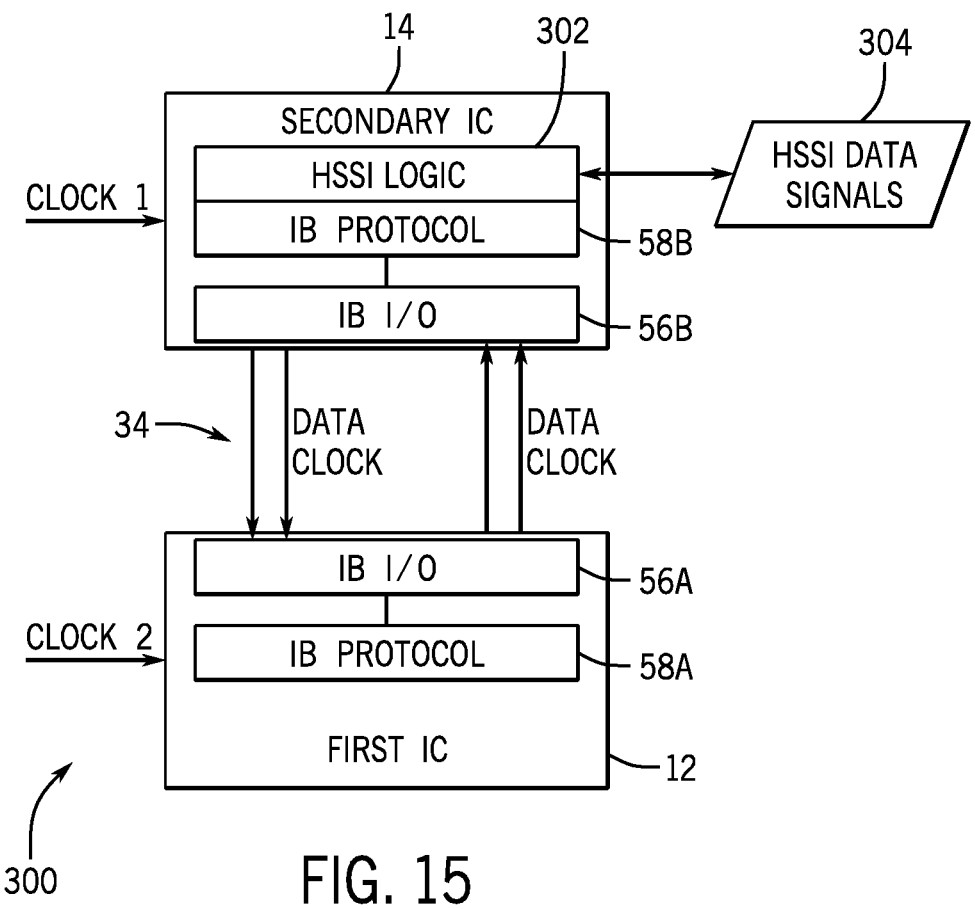
FIG. 15 is a block diagram showing source-synchronous transfer of a data bus carrying transceiver data signals, in accordance with an embodiment.

It may also be beneficial to carefully latch data buses when data buses are being transferred over the interface bridge (IB) 18. For example, as shown by a data transfer block diagram 300 of FIG. 15, the secondary IC 14 may include logic for a transceiver such as HSSI logic 302 that may receive HSSI data signals 304 from external network sources. The HSSI data signals 304 may be transferred from the secondary IC 14 to the first IC 12 through source-synchronous communication using the IB I/O layers 56A or 56B and/or D3 protocol layers 58A or 58B.

Figure 16:
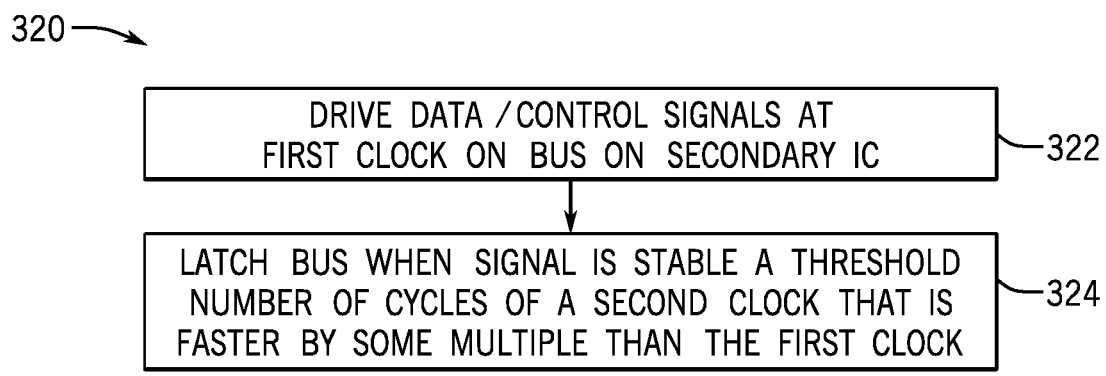
FIG. 16 is a block diagram of a flowchart for ensuring that a data bus is latched only when stable, in accordance with an embodiment.

To ensure that the data transfer occurs as desired, the IB I/O layer 56B or the IB protocol layers 58B may operate according to a flowchart 320 of FIG. 16. Namely, data signals 304 may be provided at a rate corresponding to a first clock signal (e.g., "CLOCK" of FIG. 15) or the data signals 304 may be unclocked (block 322). The data signals 304 may be latched on the data bus only when the signal is stable some threshold number of cycles (e.g., three cycles) of a receiving clock (block 324). When the data signals 304 are clocked, rather than unclocked, the receiving clock may have any suitable frequency that is faster than that of the first clock by some multiple.

Figure 17:
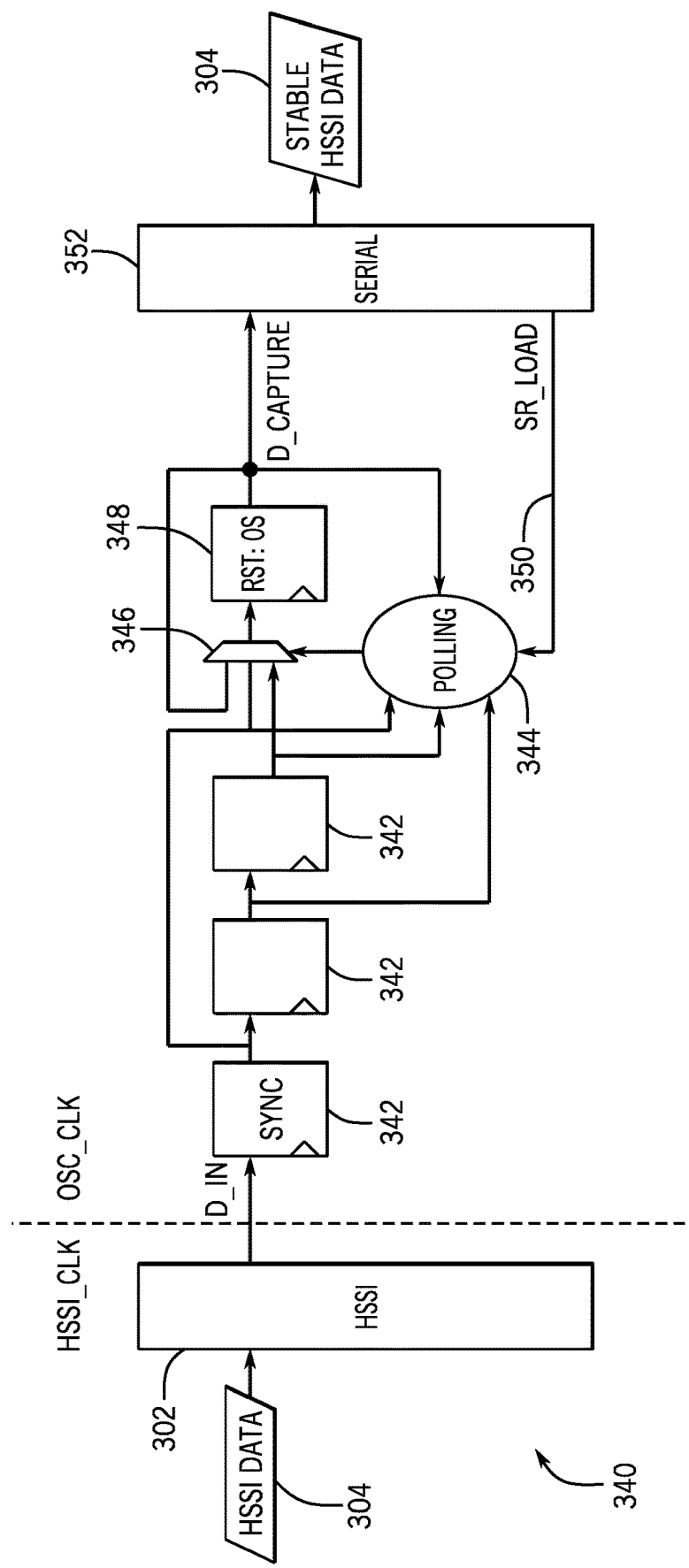
FIG. 17 is a policy-level block diagram of circuitry that may carry out the method of the flowchart of FIG. 16, in accordance with an embodiment.

FIG. 17 provides a policy-level block diagram 340 that shows an example of circuitry that may be used to carry this out. The HSSI logic 302 may receive the HSSI data 304 onto an internal data bus, which may be unclocked or clocked at the HSSI clock. Registers 342 or any suitable numbers of register 342 may be used to receive the signal at separate steps of a clock faster than the HSSI clock (e.g., OSC_CLK). When the outputs of all of the registers 342 are detected to be the same in polling logic 344, the polling logic 344 may cause a multiplexer 346 to output the signal to an output register 348, which may provide a data capture signal ("D_CAPTURE"). The polling logic 344 may do so on a register load signal ("SR_LOAD") 350 from a serial transmitter 352. The serial transmitter 352 may output stable HSSI data 304 to be transmitted across the interface bridge (IB) 18. In this way, the data 304 may be more likely to be stable and accurate, even despite slight variations of the HSSI clock.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An integrated circuit device comprising:
a sampling circuitry to sample a first portion of a plurality of signals more often than a second portion of the plurality of signals; and
a transmitter to generate a serial signal based on the plurality of signals and transmit the serial signal, wherein a frame of the serial signal comprises a first time slot comprising a flag bit indicating a state of a plurality of bits of the first time slot, a first plurality of time slots that comprise the first portion of the plurality of signals, and a second plurality of time slots that comprise the second portion of the plurality of signals.

2. The integrated circuit device of claim 1, comprising a first die, wherein the first die comprises the sampling circuitry and the transmitter.

3. The integrated circuit device of claim 2, wherein the first die comprises an interface to store the plurality of signals.

4. The integrated circuit device of claim 2, wherein:
the first plurality of time slots of the frame comprises a first number of time slots;
the second plurality of time slots of the frame comprises a second number of time slots; and
the first number of time slots is greater than the second number of time slots.

5. The integrated circuit device of claim 2, comprising a second die, wherein the second die comprises a receiver to receive the serial signal from the first die.

6. The integrated circuit device of claim 5, wherein the second die comprises:
deserialization circuitry to obtain the plurality of signals based on the serial signal; and
a second interface to store the plurality of signals obtained by the deserialization circuitry.

7. The integrated circuit device of claim 5, wherein the second die is to communicatively couple the first die to circuitry located external to the integrated circuit device.

8. The integrated circuit device of claim 7, wherein the first die comprises a processor.

9. The integrated circuit device of claim 7, comprising a substrate, wherein:
the first die and the second die are mounted on the substrate; and
the substrate comprises interconnect circuitry to communicatively couple the transmitter to the receiver.

10. The integrated circuit device of claim 1, wherein the first time slot is positioned before the first plurality of time slots or the second plurality of time slots.

11. A system comprising:
a substrate;
a first integrated circuit die mounted on the substrate, the first integrated circuit die comprising:
sampling circuitry to sample a first portion of a plurality of signals more often than a second portion of the plurality of signals; and
a transmitter to generate a serial signal based on the plurality of signals and transmit the serial signal, wherein a frame of the serial signal comprises a first time slot comprising a flag bit to indicate a state of a plurality of bits of the first time slot, a first plurality of time slots that comprise the first portion of the plurality of signals, and a second plurality of time slots that comprise the second portion of the plurality of signals, wherein the first plurality of time slots includes more time slots than the second plurality of time slots; and
a second integrated circuit die mounted on the substrate, the second integrated circuit die comprising a receiver to receive, via the substrate, the serial signal from the first integrated circuit die.

12. The system of claim 11, wherein the sampling circuitry is to cause the plurality of signals to be sampled according to a first clock over a sampling window that includes a plurality of edges of the first clock, wherein the first portion of the plurality of signals is sampled at least in part by:
detecting a current state of a signal of the first portion of the plurality of signals a defined number of times at edges of the first clock;
latching the signal when the current state is the same for the defined number of times; and
outputting the latched signal into a sampling register.

13. The system of claim 11, wherein:
the first integrated circuit die comprises a processor; and
the second integrated circuit die is to communicatively couple the processor to circuitry external to the system.

14. The system of claim 11, wherein the sampling circuitry is to sample the first portion of the plurality of signals at least twice as often as the second portion of the plurality of signals.

15. The system of claim 11, wherein the second integrated circuit die comprises:
deserialization circuitry to obtain the plurality of signals based on the serial signal; and
a second interface to store the plurality of signals obtained by the deserialization circuitry.

16. The integrated circuit device of claim 11, wherein the first time slot is positioned before the first plurality of time slots or the second plurality of time slots.

17. A system comprising:
a substrate; and
a first integrated circuit die mounted on the substrate, wherein the first integrated circuit die comprises:
sampling circuitry clocked to a clock, wherein the sampling circuitry is to:
receive a plurality of signals comprising a signal and a second signal;
sample the signal at a first sampling rate to produce a first plurality of sampled signals, wherein the signal is sampled over a sampling window that includes a plurality of edges of the clock, wherein the signal is sampled at least in part by:
detecting a current state of the signal a defined number of times at edges of the clock;
latching the signal when the current state is the same for the defined number of times; and
outputting the latched signal into a sampling register; and
sample the second signal of the plurality of signals at a second sampling rate to produce a second plurality of sampled signals, wherein the first sampling rate is a higher frequency than the second sampling rate;
a transmitter to generate a serial signal based on the plurality of signals transmit the serial signal, wherein a frame of the serial signal comprises:
a first plurality of time slots that comprises the first plurality of sampled signals; and
a second plurality of time slots that comprises the second plurality of sampled signals.

18. The system of claim 17, comprising a second integrated circuit die mounted on the substrate, wherein the second integrated circuit die comprises a receiver to receive, via the substrate, the serial signal.

19. The system of claim 18, wherein:
the first integrated circuit die comprises a processor; and
the second integrated circuit die is to communicatively couple the processor to circuitry external to the system.

20. The system of claim 18, wherein the second integrated circuit die comprises:
deserialization circuitry to obtain the plurality of signals based on the serial signal; and
a second interface to store the plurality of signals obtained by the deserialization circuitry.

* * * * *